(12) United States Patent
Kang et al.

(10) Patent No.: US 12,484,234 B2
(45) Date of Patent: Nov. 25, 2025

(54) RESISTIVE RANDOM-ACCESS MEMORY ELEMENTS WITH LATERAL SIDEWALL SWITCHING

(71) Applicant: GlobalFoundries Singapore Pte. Ltd., Singapore (SG)

(72) Inventors: Kai Kang, Singapore (SG); Curtis Chun-I Hsieh, Singapore (SG); Jianxun Sun, Singapore (SG); Juan Boon Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 432 days.

(21) Appl. No.: 18/140,677

(22) Filed: Apr. 28, 2023

(65) Prior Publication Data

US 2024/0365566 A1   Oct. 31, 2024

(51) Int. Cl.
*H10B 63/00* (2023.01)

(52) U.S. Cl.
CPC .................... *H10B 63/80* (2023.02)

(58) Field of Classification Search
CPC .............................. H10B 63/80; H10N 70/20
See application file for complete search history.

(56) References Cited

U.S. PATENT DOCUMENTS

| 9,559,107 B2 | 1/2017 | Briggs et al. |
| 10,608,177 B2 | 3/2020 | Lv et al. |
| 11,227,997 B1 | 1/2022 | Dutta et al. |

*Primary Examiner* — Marvin Payen
(74) *Attorney, Agent, or Firm* — Thompson Hine LLP

(57) ABSTRACT

Structures for a resistive random-access memory element and methods of forming a structure for a resistive random-access memory element. The structure comprises an interlayer dielectric layer including a first trench having a sidewall and a second trench having a sidewall adjacent to the sidewall of the first trench. The structure further comprises a first layer on the sidewall of the first trench, a second layer inside the second trench, and a third layer on the sidewall of the second trench. The first layer comprises a first metal, the second layer comprises a second metal, and the third layer comprises a dielectric material. The third layer includes a portion positioned between the first layer and the second layer.

20 Claims, 5 Drawing Sheets

RESISTIVE RANDOM-ACCESS MEMORY ELEMENTS WITH LATERAL SIDEWALL SWITCHING

BACKGROUND

This disclosure relates to integrated circuits and semiconductor device fabrication and, more specifically, to structures for a resistive random-access memory element and methods of forming a structure for a resistive random-access memory element.

A resistive random-access memory device provides one category of embedded non-volatile memory technology. A bitcell of a resistive random-access memory device typically includes a resistive random-access memory element and an access transistor that controls operations used to write, erase, and read the resistive random-access memory element. Because resistive random-access memory elements are non-volatile, bits of data are retained as stored content by the resistive random-access memory elements when the resistive random-access memory device is unpowered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

A resistive random-access memory element includes a switching layer that is positioned in a layer stack between a bottom electrode and a top electrode. The resistive random-access memory element can be programmed by changing the resistance across the switching layer to provide different content-storage conditions, namely a high-resistance state and a low-resistance state, representing the stored bits of data. The switching layer can be modified by applying a programming voltage between the bottom and top electrodes that is sufficient to create one or more conductive filaments bridging across the thickness of the switching layer, which sets the low-resistance state. The conductive filaments can be destroyed, also by the application of a programming voltage between the bottom and top electrodes, to reset the resistive random-access memory element to the high-resistance state. The content-storage condition can be read by measuring a voltage drop across the resistive random-access memory element after it has been programmed.

Improved structures for a resistive random-access memory element and methods of forming a structure for a resistive random-access memory element are needed.

SUMMARY

According to an embodiment of the invention, a structure for a random-access resistive random-access memory device is provided. The structure comprises an interlayer dielectric layer including a first trench having a sidewall and a second trench having a sidewall adjacent to the sidewall of the first trench. The structure further comprises a first layer on the sidewall of the first trench, a second layer inside the second trench, and a third layer on the sidewall of the second trench. The first layer comprises a first metal, the second layer comprises a second metal, and the third layer comprises a dielectric material. The third layer includes a portion positioned between the first layer and the second layer.

According to another embodiment of the invention, a method of forming a structure for a random-access resistive random-access memory device is provided. The method comprises forming an interlayer dielectric layer, forming a first trench in the interlayer dielectric layer, and forming a second trench in the interlayer dielectric layer. The second trench has a sidewall adjacent to a sidewall of the first trench. The method further comprises forming a first layer on the sidewall of the first trench, forming a second layer inside the second trench, and forming a third layer on the sidewall of the second trench. The first layer comprises a first metal, the second layer comprises a second metal, the third layer comprises a dielectric material, and the third layer includes a portion positioned between the first layer and the second layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
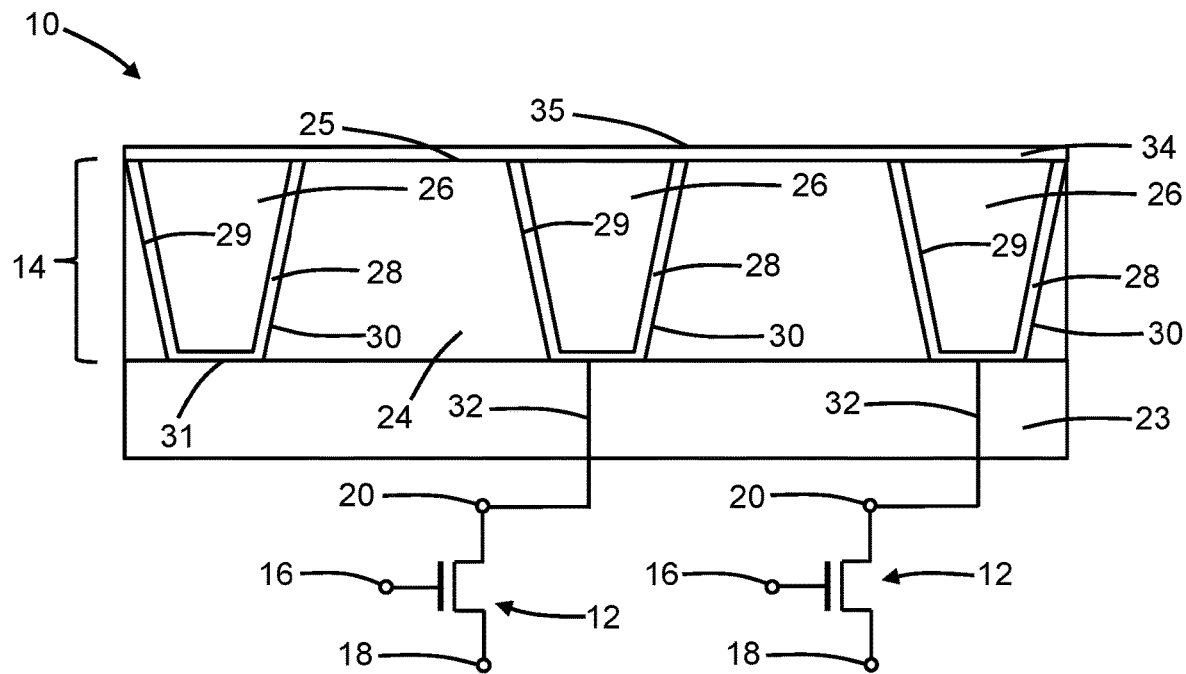
FIGS. 1-5 are cross-sectional views of a structure at successive fabrication stages of a processing method in accordance with embodiments of the invention.

With reference to FIG. 1 and in accordance with embodiments of the invention, a structure 10 includes transistors 12 that are configured to control access to subsequently-formed non-volatile memory elements and a metallization level 14 of an interconnect structure over the transistors 12. Each transistor 12 may function as a bitcell access transistor that includes a gate electrode 16, a source 18, and a drain 20, and the transistors 12 may be formed by front-end-of-line processing of a substrate, such as a silicon-on-insulator substrate or a bulk semiconductor substrate. The gate electrode 16 may be comprised of a conductor, such as doped polycrystalline silicon (i.e., polysilicon) or one or more work-function metals, and a gate dielectric comprised of an electrical insulator, such as silicon dioxide or a high-k dielectric material characterized by a dielectric constant greater than the dielectric constant of silicon dioxide. The source 18 and drain 20 may be comprised of a doped semiconductor material, such as doped silicon or doped silicon-germanium. The transistors 12 may be, for example, n-type planar field-effect transistors.

The metallization level 14 may be fabricated by back-end-of-line processing as a wiring layer of the interconnect structure. The metallization level 14 may include an interlayer dielectric layer 24 that is positioned on an interlayer dielectric layer 23 of the interconnect structure, and metal features 26 that are positioned in trenches 30 patterned in the interlayer dielectric layer 24. Each trench 30 may include sidewalls 29 that extend from a bottom 31 to a top surface 25 of the interlayer dielectric layer 24. In an embodiment, the trenches 30 may be tapered with a width dimension that decreases with increasing distance from the top surface 25. The interlayer dielectric layer 24 may be comprised of a dielectric material, such as silicon dioxide or a low-k dielectric material characterized by a dielectric constant less than the dielectric constant of silicon dioxide, that is an electrical insulator. The metal features 26 may be comprised of a metal, such as copper. In an embodiment, the metal features 26 may be formed in the interlayer dielectric layer 24 by a damascene process.

A layer 28 is formed inside each trench 30 before the metal features 26 are formed. The layer 28 may coat the interlayer dielectric layer 24 at the sidewalls 29 of each trench 30, as well as the interlayer dielectric layer 23 at the bottom 31 of each trench 30, as a conformal liner having a uniform or substantially uniform thickness. In an embodiment, the layer 28 inside each trench 30 may adjoin the sidewalls 29 and the bottom 31. In an embodiment, the layer 28 inside each trench 30 may extend along the sidewalls 29 from the bottom 31 to the top surface 25 of the interlayer dielectric layer 24 and may also cover the bottom 31. The layer 28 in each trench 30 is positioned between the associated metal feature 26 and the dielectric material of the interlayer dielectric layers 23, 24. In an embodiment, the metal feature 26 and the layer 28 inside each trench 30 may be positioned in direct physical and electrical contact with each other. In an embodiment, the layers 28 may be comprised of a metal, such as tantalum, tantalum nitride, or a combination of tantalum and tantalum nitride. Each layer 28 may define an electrode of a resistive random-access memory element.

The interconnect structure may include additional metallization levels (not shown), in addition to the metallization level including the interlayer dielectric layer 23, that intervene between the transistors 12 and the metallization level 14. In an embodiment, the drain 20 of each transistor 12 may be physically and electrically coupled to the one of the metal features 26 by an interconnection 32 formed in the additional metallization levels. The interconnections 32 may include metal islands, vias, and/or contacts arranged in the interlayer dielectric layer 23 and the interlayer dielectric layers of the additional metallization levels.

A dielectric layer 34 is formed on the top surface 25 of the interlayer dielectric layer 24 and on the metal features 26. In an embodiment, the dielectric layer 34 may be comprised of a dielectric material, such as nitrogen-doped silicon carbide or nitrogen-doped hydrogenated silicon carbide, that is an electrical insulator. The dielectric layer 34 has a top surface 35 and a bottom surface opposite to the top surface 35. In an embodiment, the dielectric layer 34 may overlap with the metal feature 26 and layer 28 inside each trench 30. An upper portion of each metal feature 26 is positioned adjacent to the dielectric layer 34, and the upper portion of each metal feature 26 may include corners at the interface between the dielectric layer 34 and the interlayer dielectric layer 24 at the top surface 25. In an embodiment, the layer 28 inside each trench 30 may extend to the interface between the interlayer dielectric layer 24 and the dielectric layer 34 at the top surface 25.

Figure 2:
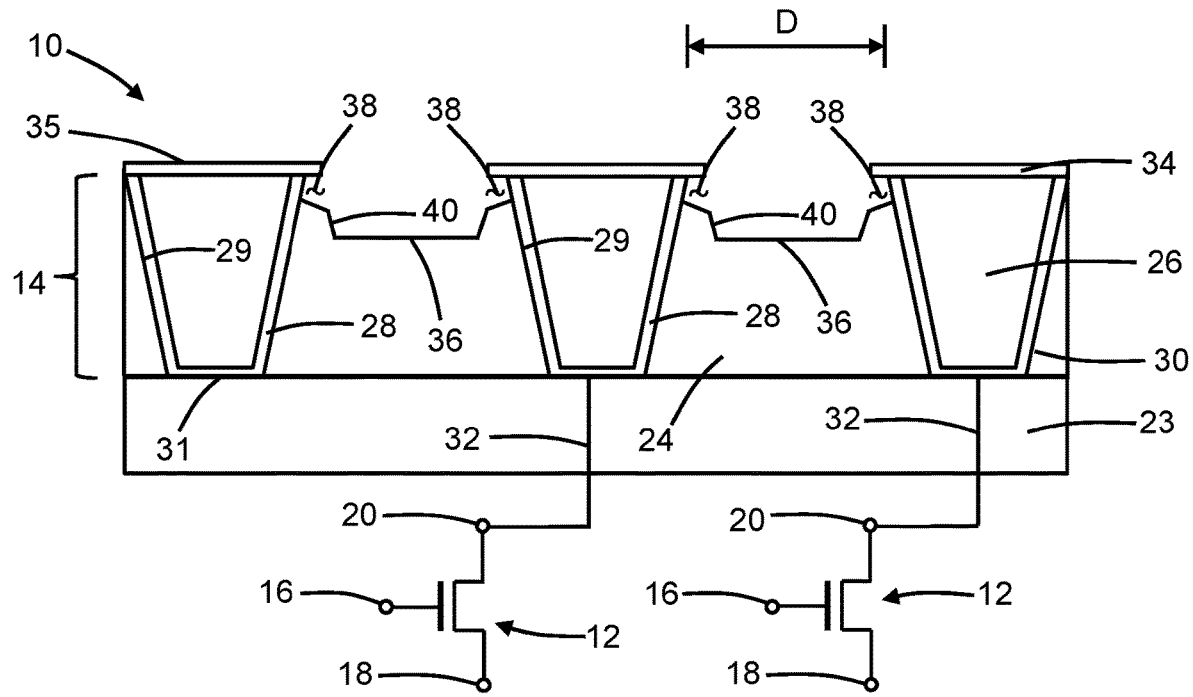

With reference to FIG. 2 in which like reference numerals refer to like features in FIG. 1 and at a subsequent fabrication stage, the dielectric layer 34 may be patterned by lithography and etching processes to define openings that are generally aligned with respective surface areas of the interlayer dielectric layer 24 between adjacent metal features 26. In an embodiment, the width dimension of the openings in the dielectric layer 34 may be less than the distance D between adjacent corners of nearest-neighbor metal features 26. Sections of the patterned dielectric layer 34 are positioned on the top surfaces of the metal features 26.

Trenches 36 may be formed by one or more etching processes in the interlayer dielectric layer 24 at the locations of the openings in the dielectric layer 34. In an embodiment, the trenches 36 may be formed by a multiple-step process that includes, for example, a reactive etching process followed by exposure to a dilute hydrogen fluoride solution that is characterized by a lateral etching component. The patterned dielectric layer 34 functions as a hardmask for the one or more etching process forming the trenches 36. In an embodiment, the trenches 36 may extend to a shallower depth into the interlayer dielectric layer 24 than the trenches 30 holding the metal features 26 and layers 28. Each trench 36 has a profile defined by a sidewall 40.

An upper portion of each trench 36 includes lateral extensions 38 that project as undercuts or chambers beneath the adjacent sections of the dielectric layer 34 at the edges of the openings in the patterned dielectric layer 34. The lateral extensions 38 may be positioned in an upper portion of each trench 36, and the lateral extensions 38 may extend in a lateral direction beneath the lower surface of the adjacent sections of the dielectric layer 34. In an embodiment, a lower portion of each trench 36 may be tapered. Each lateral extension 38 may have a width dimension that decreases with decreasing distance from the layer 28 on the sidewall 29 of the adjacent trench 30 and a smallest width dimension immediately adjacent to the sidewall 29 of the trench 30. In an embodiment, the layer 28 may operate as an etch stop for the etching process forming the lateral extensions 38.

Figure 3:
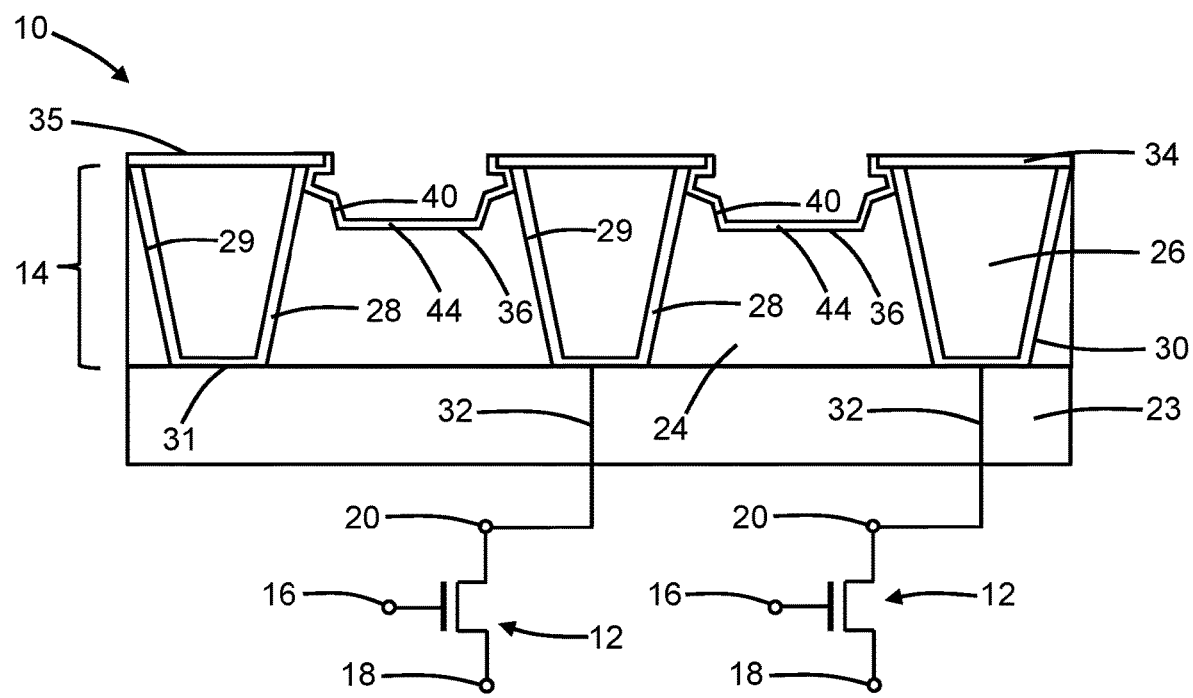

With reference to FIG. 3 in which like reference numerals refer to like features in FIG. 2 and at a subsequent fabrication stage, a layer 44 is formed as a conformal liner that coats surfaces inside each trench 36. In an embodiment, the layers 44 may be deposited by atomic layer deposition. In an embodiment, the layers 44 may have a uniform thickness on the surfaces inside each trench 36 and conform to the profile defined by the sidewall 40. In an embodiment, the layers 44 may be comprised of a material capable of functioning as a switching layer in a resistive random-access memory element. In an embodiment, the layers 44 may be comprised of a metal oxide, such as hafnium oxide. The layers 44 may include portions that are positioned inside the lateral extensions 38. In an embodiment, the portions of the layers 44 inside the lateral extensions 38 of the trenches 36 may adjoin the layers 28. In an embodiment, the portions of the layers 44 inside the lateral extensions 38 of the trenches 36 may be positioned in direct physical and electrical contact with the layers 28. In an embodiment, the layers 44 may be deposited without pinching off the lateral extensions 38.

Figure 4:
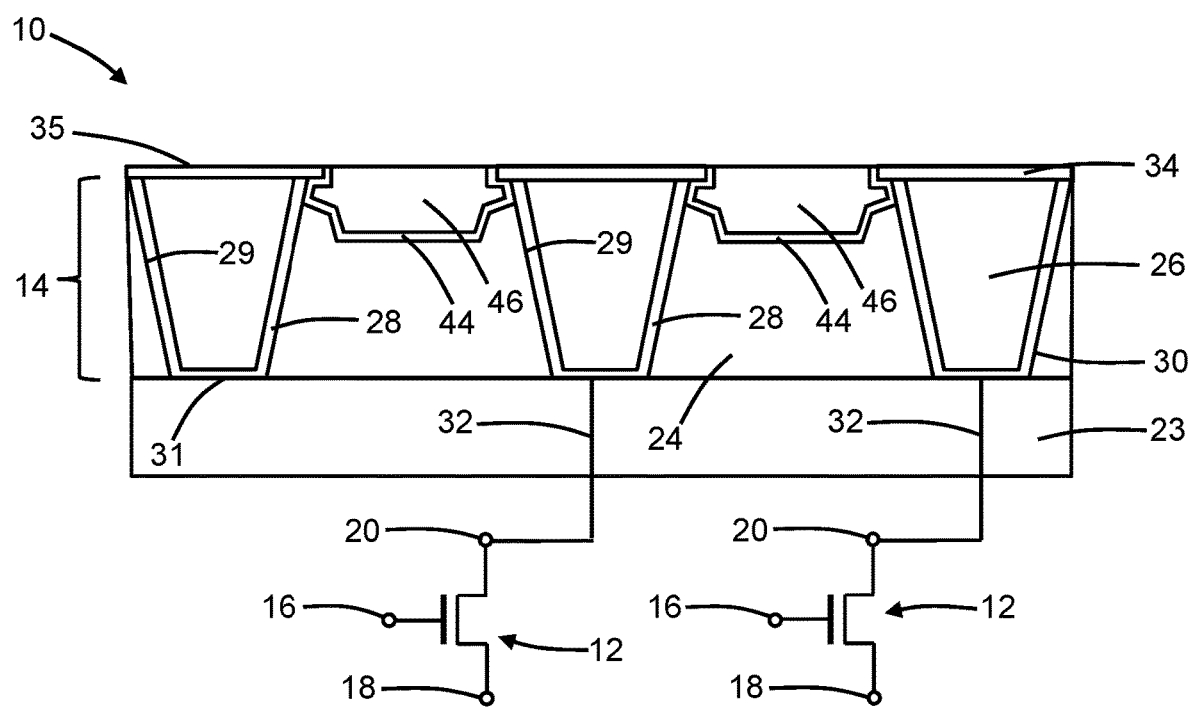

With reference to FIG. 4 in which like reference numerals refer to like features in FIG. 3 and at a subsequent fabrication stage, a layer 46 is formed as an electrode of a resistive random-access memory element inside each trench 36. The layer 46, which is positioned on the layer 44, may fill the portion of each trench 36 that is not occupied by the layer 44. In an embodiment, the layers 46 may be characterized by a uniform thickness. In an embodiment, the layers 46 may be comprised of a metal, such as tantalum, tantalum nitride, or a combination of tantalum and tantalum nitride. In an embodiment, the layers 46 positioned inside the trenches 36 may be positioned in direct physical and electrical contact with the layers 44. In an embodiment, the layers 46 positioned inside the trenches 36 may adjoin the portions of the layers 44 inside the lateral extensions 38. The layers 44, 46 may be planarized following their deposition using, for example, chemical mechanical polishing.

Figure 5:
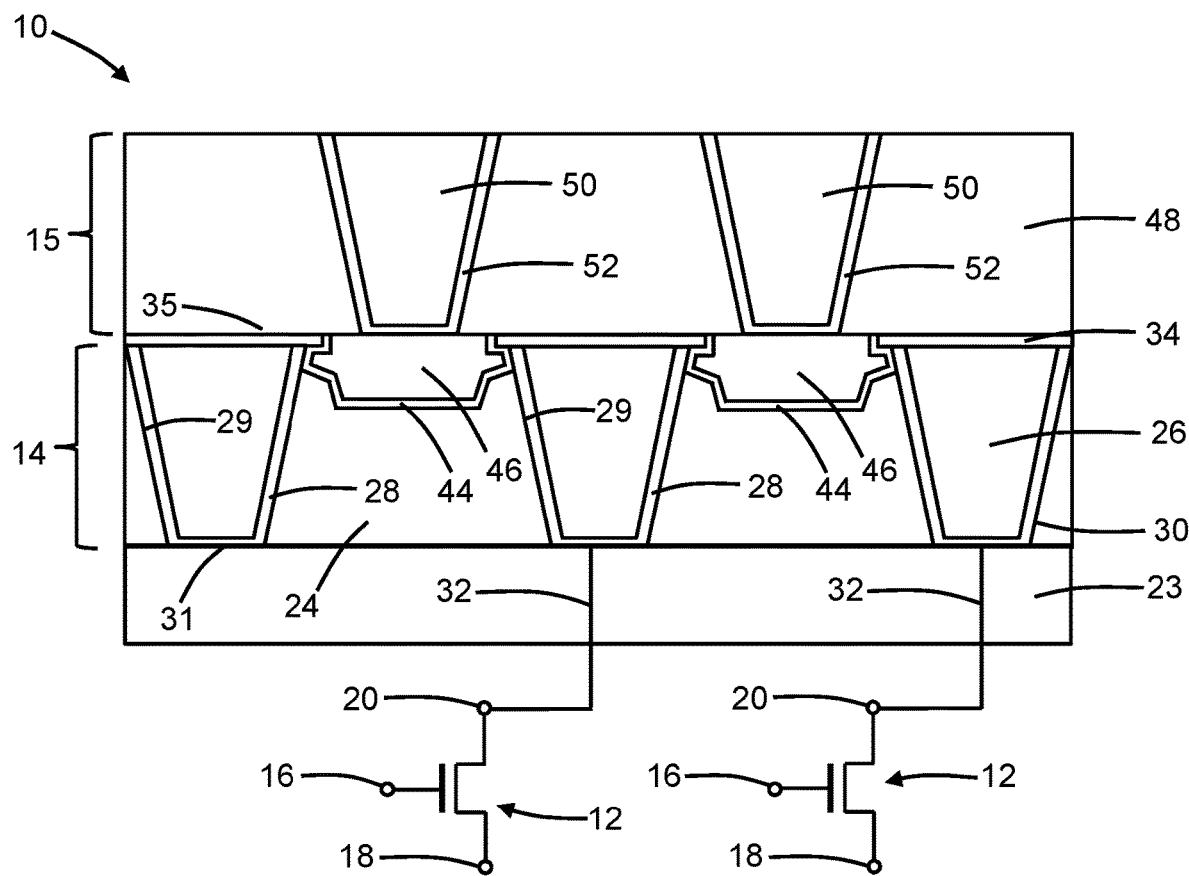

With reference to FIG. 5 in which like reference numerals refer to like features in FIG. 4 and at a subsequent fabrication stage, an interlayer dielectric layer 48 of a metallization level 15 may be formed over the metallization level 14 including the interlayer dielectric layer 24. Metal features 50 may be formed in trenches that are patterned by lithography and etching processes in the interlayer dielectric layer 48. The interlayer dielectric layer 48 may be comprised of a dielectric material, such as silicon dioxide, that is an electrical insulator. The metal features 50 may be comprised of a metal, such as copper, and the metal features 50 may be formed by deposition and planarization in respective openings that are patterned in the interlayer dielectric layer 48. The trenches holding the metal features 50 may be lined by a layer 52 that may be comprised of a metal, such as tantalum, tantalum nitride, or a combination of tantalum and tantalum nitride. Each metal feature 50 is coupled to the layer 46 of one of the resistive random-access memory elements.

Each resistive random-access memory element is characterized by lateral sidewall switching at consistent switching locations inside the lateral extensions 38. A programming voltage may be applied across the layer 28 inside each lateral extension 38 between the layer 28 and the layer 46 to set a low-resistance state in which one or more conductive filaments bridge across the thickness of the layer 44. The metal features 26 and the metal features 50 may facilitate the application of the programming voltage.

Figure 6:
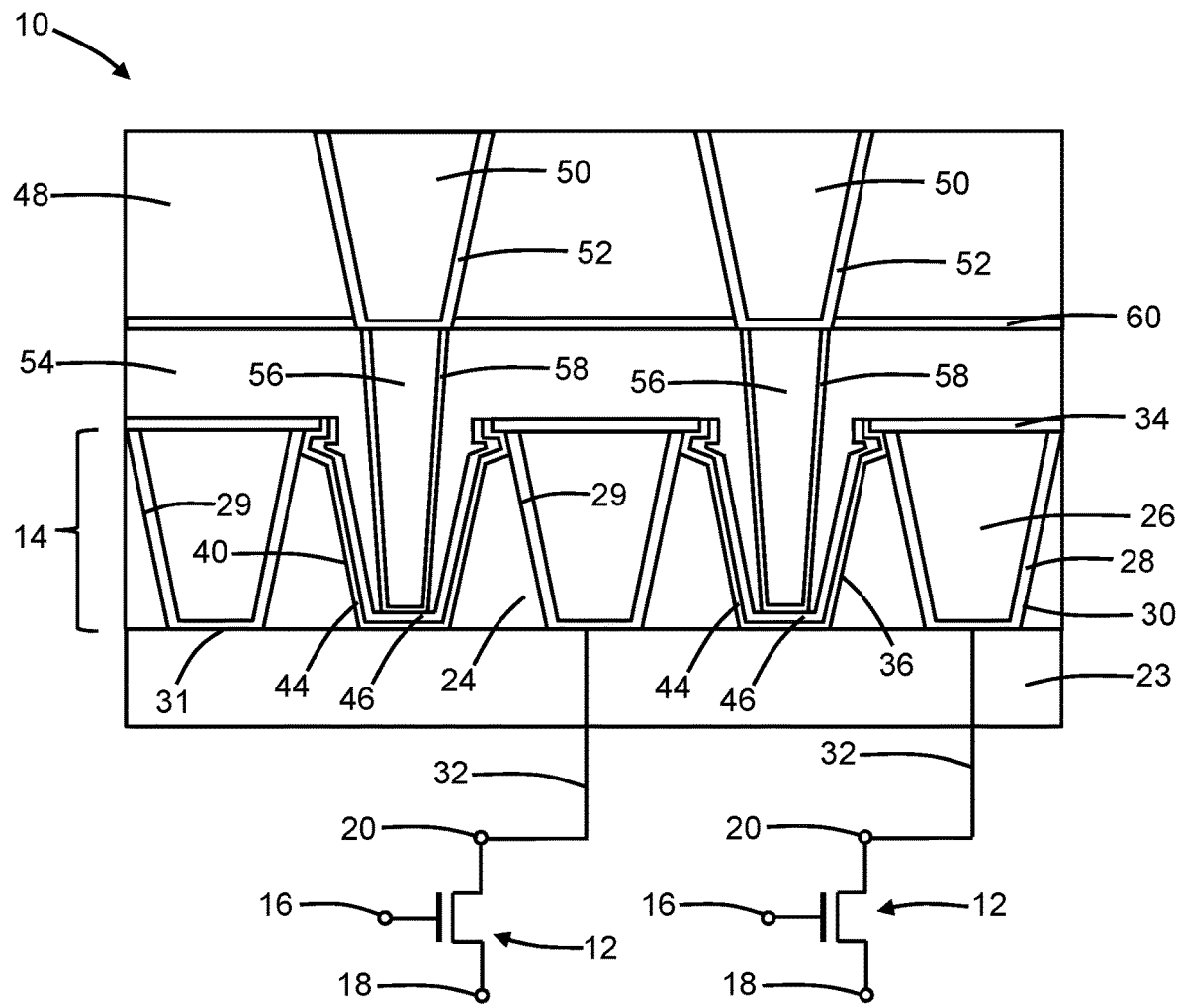
FIG. 6 is a cross-sectional view of a structure in accordance with embodiments of the invention.

With reference to FIG. 6 and in accordance with alternative embodiments, the structure 10 may be modified to increase the depth of the trenches 36. In an embodiment, the trenches 36 may have a depth that is equal or substantially equal to the depth of the trenches 30. Each layer 46 may be formed as a conformal film that coats the conformal layer 44 on the sidewall 40 of the associated trench 36. In particular, each layer 46 includes a conformal portion on the conformal portion of the layer 44 inside each lateral extension 38.

An interlayer dielectric layer 54 may be formed over the interlayer dielectric layer 24. A portion of the interlayer dielectric layer 54 may fill the space inside each trench 36 that is not occupied by the layers 44, 46. Metal features 56 may be formed in trenches that are patterned by lithography and etching processes in the interlayer dielectric layer 54. The interlayer dielectric layer 54 may be comprised of a dielectric material, such as silicon dioxide, that is an electrical insulator. The metal features 56 may be comprised of a metal, such as copper, and the metal features 56 may be formed by deposition and planarization in respective openings that are patterned in the interlayer dielectric layer 54. The trenches holding the metal features 56 may be lined by a layer 58 that may be comprised of a metal, such as tantalum, tantalum nitride, or a combination of tantalum and tantalum nitride. Each metal feature 56 may be positioned in physical and electrical contact with a portion of the layer 46 at the bottom 31 of each trench 36.

The interlayer dielectric layer 48 may be formed over the interlayer dielectric layer 54. The metal features 50 in the interlayer dielectric layer 48 are coupled to the metal features 56. A dielectric layer 60 may be formed on the interlayer dielectric layer 54 before forming the interlayer dielectric layer 54 and may function as an etch stop when patterning the trenches for the metal features 50. In an embodiment, the dielectric layer 60 may be comprised of a dielectric material, such as nitrogen-doped silicon carbide or nitrogen-doped hydrogenated silicon carbide, that is an electrical insulator.

Figure 7:
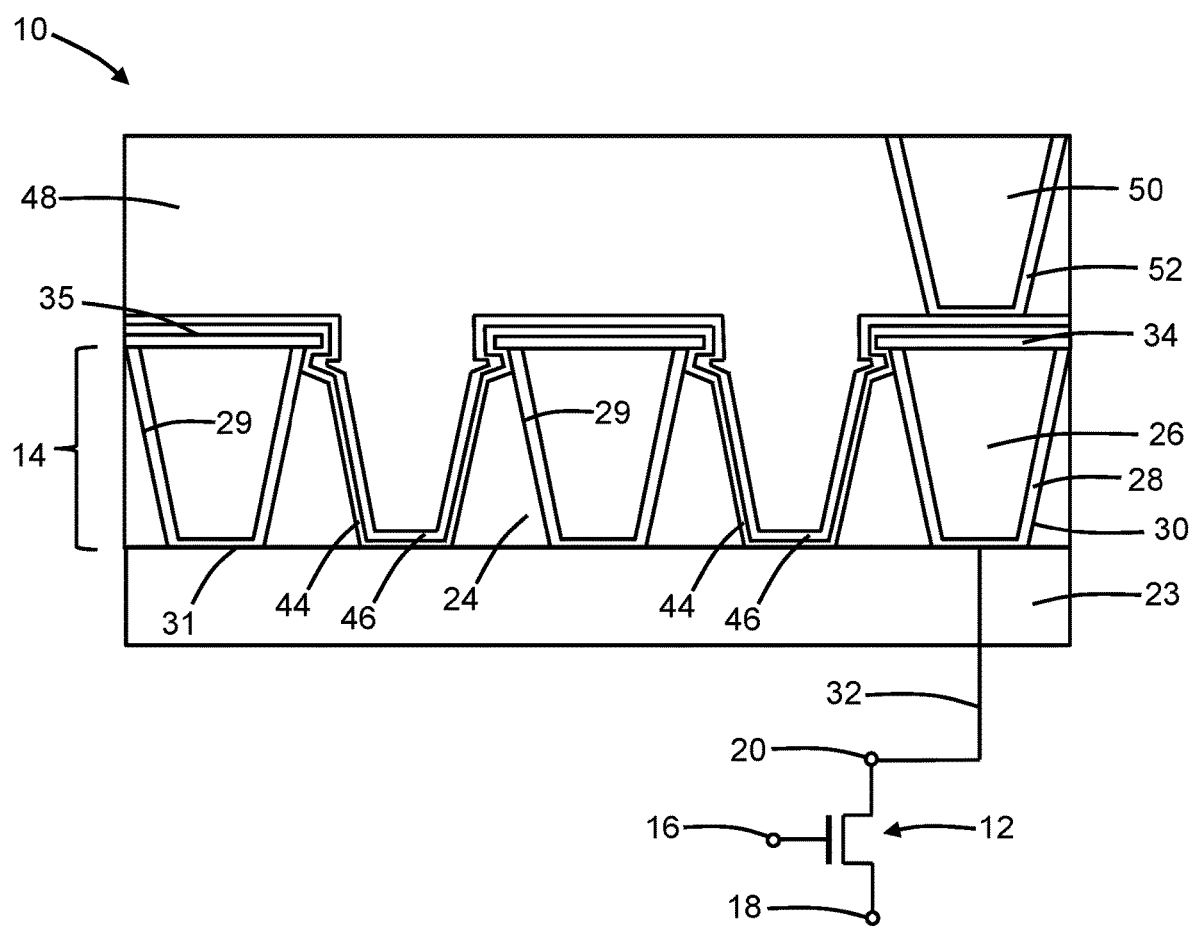
FIG. 7 is a cross-sectional view of a structure in accordance with embodiments of the invention.

With reference to FIG. 7 and in accordance with alternative embodiments, the structure 10 may be modified such that the layer 44 and the layer 46 conformally extend over the sections of the patterned dielectric layer 34 in addition to being conformally positioned inside the trenches 36. More specifically, the layer 44 may include a portion that is positioned on the top surface 35 of each section of the dielectric layer 34 over the metal features 26, and the layer 46 may include a portion that is positioned on the portion of the layer 44 that is positioned on the top surface 35 of each section of the dielectric layer 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a random-access resistive memory device, the structure comprising:

a first interlayer dielectric layer including a first trench having a sidewall and a second trench having a sidewall adjacent to the sidewall of the first trench;

a first layer on the sidewall of the first trench, the first layer comprising a first metal;

a second layer inside the second trench, the second layer comprising a second metal; and a third layer on the sidewall of the second trench, the third layer comprising a first dielectric material, and the third layer including a first portion positioned between the first layer and the second layer.

2. The structure of claim 1 wherein the first metal comprises tantalum nitride.

3. The structure of claim 1 wherein the first dielectric material comprises hafnium oxide.

4. The structure of claim 1 wherein the second metal comprises tantalum nitride.

5. The structure of claim 1 wherein the second trench includes a lateral extension, and the first portion of the third layer is positioned in the lateral extension.

6. The structure of claim 5 wherein the first interlayer dielectric layer has a top surface, and further comprising:

a dielectric layer positioned on the top surface of the first interlayer dielectric layer, the dielectric layer having a first portion overlapping with the first trench and a second portion overlapping with the lateral extension of the second trench.

7. The structure of claim 6 wherein the third layer includes a second portion positioned on the dielectric layer, and the second layer includes a second portion positioned on the second portion of the third layer.

8. The structure of claim 7 further comprising:

a second interlayer dielectric layer on the first interlayer dielectric layer; and a metal feature in the second interlayer dielectric layer, the metal feature coupled to the second portion of the second layer.

9. The structure of claim 5 wherein the second layer includes a first portion positioned inside the lateral extension of the second trench, and the first portion of the third layer is positioned between the first layer and the first portion of the third layer.

10. The structure of claim 9 wherein the third layer is conformally positioned on the sidewall of the second trench, and the second layer is conformally positioned with a substantially uniform thickness on the third layer.

11. The structure of claim 1 wherein the first portion of the third layer is positioned adjacent to the first layer, and the first portion of the third layer is positioned adjacent to the second layer.

12. The structure of claim 1 wherein the first portion of the third layer adjoins the first layer, and the first portion of the third layer adjoins the second layer.

13. The structure of claim 1 wherein the first layer is conformally positioned with a substantially uniform thickness on the sidewall of the first trench.

14. The structure of claim 1 wherein the third layer is conformally positioned with a substantially uniform thickness on the sidewall of the second trench.

15. The structure of claim 14 wherein the second layer is conformally positioned with a substantially uniform thickness on the third layer.

16. The structure of claim 13 further comprising:

a second interlayer dielectric layer on the first interlayer dielectric layer, the second interlayer dielectric layer comprising a second dielectric material, wherein the second dielectric material of the second interlayer dielectric layer is positioned inside the second trench, and a first portion of the second layer and the first portion of the third layer are positioned between the first layer and the second dielectric material of the second interlayer dielectric layer.

17. The structure of claim 16 further comprising:

a metal feature in the second interlayer dielectric layer, the metal feature coupled to a second portion of the second layer.

18. The structure of claim 1 wherein the first layer is conformally positioned on the sidewall of the first trench, the third layer is conformally positioned on the sidewall of the second trench, the second layer is conformally positioned on the third layer, and the first layer, the second layer, and the third layer have substantially uniform thicknesses.

19. The structure of claim 1 further comprising:

a metal feature inside the first trench, the first layer positioned between the first portion of the third layer and the metal feature.

20. A method of forming a structure for a random-access resistive memory device, the method comprising:

forming an interlayer dielectric layer;

forming a first trench in the interlayer dielectric layer;

forming a second trench in the interlayer dielectric layer, the second trench having a sidewall adjacent to a sidewall of the first trench;

forming a first layer on the sidewall of the first trench, wherein the first layer comprises a first metal;

forming a second layer inside the second trench, wherein the second layer comprises a second metal; and forming a third layer on the sidewall of the second trench, wherein the third layer comprises a dielectric material, and the third layer includes a portion positioned between the first layer and the second layer.

* * * * *